United States Patent
Furuno

[11] Patent Number: 5,901,026
[45] Date of Patent: May 4, 1999

[54] OUTPUT TRANSISTOR PROTECTION CIRCUIT

[75] Inventor: Satoshi Furuno, Nakasma, Japan

[73] Assignee: Rohm Co. Ltd., Kyoto, Japan

[21] Appl. No.: 08/884,559

[22] Filed: Jun. 27, 1997

[30] Foreign Application Priority Data

Jun. 27, 1996 [JP] Japan ..................................... 8-167614

[51] Int. Cl.⁶ .................................................. H02H 3/08
[52] U.S. Cl. ............................................. 361/101; 361/54
[58] Field of Search .................. 361/18, 54, 56, 361/57, 91, 93, 101

[56] References Cited

U.S. PATENT DOCUMENTS 5,710,508 1/1998 Watanabe ................................... 361/18

Primary Examiner—Sally C. Medley
Attorney, Agent, or Firm—Nikaido, Marmelstein, Murray & Oram LLP

[57] ABSTRACT

A protection circuit for a pnp-type output transistor includes a pnp-type monitor transistor through which a current 1/n (where n>1) times as high as the output current of the output transistor passes. A first, second, and third resistor are connected between the output electrode of the output transistor and ground. An output terminal is connected to the collector of the output transistor. A fourth and fifth resistor are connected serially between the output current of the monitor transistor and ground. When the voltage at the node between the fourth and fifth resistors exceeds a predetermined level, the conduction biases for the output and monitor transistors are reduced. When the voltage at the node between the first and second resistors drops below the voltage at the output side of the monitor transistor, the conduction biases are further reduced in accordance with the voltage difference.

10 Claims, 4 Drawing Sheets

OUTPUT TRANSISTOR PROTECTION CIRCUIT

BACKGROUND OF THE INVENTION

1. Field of the Invention

The present invention relates to an output transistor protection circuit for use in a power supply circuit, audio power amplifier, or the like.

2. Description of the Prior Art

In a power supply circuit, audio power amplifier, or the like, an output transistor may be subjected to momentary overcurrent when, for example, the load is in trouble. Therefore, in such circuits, it is essential that the output transistor be protected from destruction by some protection circuit.

FIG. 1 shows an example of a conventional output transistor protection circuit. In this protection circuit, the transistor T10 serves as an output transistor, and its collector is connected to an output terminal 30 and is also connected through resistors R11 and R12 to ground. The node a between these resistors R11 and R12 is connected to the base of the transistor T6.

In this protection circuit, the transistors T1 to T8 constitute a comparator 31. This comparator 31 compares the voltage Va at the node a with a reference voltage Vref, which is applied to the base of the transistor T1. The output current $I_1$ from the comparator 31 is fed through the transistors T7 and T8 to the base of the output transistor T10 as negative feedback. Accordingly, the comparator 31 serves to keep the voltage Va at the node a equal to the reference voltage Vref. Numeral 32 represents a constant current source.

The transistor T11 serves as a monitor transistor, and its base and emitter are connected to the base and emitter, respectively, of the output transistor T10. The monitor transistor T11 is so formed that, when a current I flows through the output transistor T10, a current 1/n times as high as that current I (i.e. a current I/n) flows through the transistor T11. The collector of the monitor transistor T11 is connected through a resistor R13 to ground and is also connected directly to the base of the npn-type transistor T9.

This protection circuit feeds its output current Io via the output terminal 30 to a load (not shown). As the output current Io increases, the current I increases accordingly, and so does the current I/n, which flows through the transistor T11 and the resistor R13. As a result, the voltage Vb across the resistor R13 rises above the threshold voltage of the transistor T9 and thereby turns on the transistor T9.

In normal condition, the transistors T2 and T3 are balanced, so that the transistor T3 feeds a constant current to the base of the transistor T7. However, once the transistor T9 is turned on, the base current of the transistor T7 decreases accordingly, and so does the current $I_1$, which flows through the transistor T8. As a result, the base currents of the transistors T10 and T11 decrease, and thus both of the currents I and I/n decrease. In this way, overcurrent is suppressed.

As described above, in the conventional protection circuit, overcurrent is prevented by turning on the transistor T9 and thereby decreasing the drive current (the base current, in this case) to the output transistor T10. However, since this protection circuit uses negative feedback, it attempts to keep its balance and thus to operate linearly even when the transistor T9 is turned on. As a result, this protection circuit exhibits an operation characteristic as shown in FIG. 2. As seen from FIG. 2, the conventional protection circuit operates too slowly to achieve effective protection against momentary overcurrent (such as rush current). In FIG. 2, the output current Io is taken along the horizontal axis, and the output voltage Vo is taken along the vertical axis.

Moreover, in the conventional protection circuit, the output current Io is at its maximum when the output voltage Vo is clamped at a comparatively low level as indicated by A in FIG. 2. In addition, since the voltage between the collector and emitter of the transistor T10 equals Vcc−Vo, this voltage becomes higher as the output voltage Vo at the node A becomes lower. This means that the transistor T10 is in some cases subjected simultaneously to overvoltage and overcurrent, each of which is on its own damaging to any transistor. Thus, the conventional protection circuit exposes the transistor 10 to higher risk of destruction.

SUMMARY OF THE INVENTION

An object of the present invention is to provide an output transistor protection circuit whose response is sufficiently quick to achieve effective protection against even momentary overcurrent.

Another object of the present invention is to provide an output transistor protection circuit that can greatly reduce its output current even when its output voltage is clamped at a low level as a result of trouble on the part of the load.

To achieve the above objects, according to the present invention, an output transistor protection circuit comprises a monitor transistor whose base and emitter are connected to a base and an emitter, respectively, of an output transistor and through which passes a current 1/n (where n>1) times as high as an output current of the output transistor; a first resistor circuit composed of a plurality of resistors connected between an output side of the output transistor and a reference voltage point; an output terminal connected to the output side of the output transistor; a second resistor circuit composed of a plurality of resistors connected between an output side of the monitor transistor and the reference voltage point; first means that decreases conduction biases for the output transistor and the monitor transistor when a voltage at a specific point in the second resistor circuit exceeds a predetermined level; and second means that further decreases the conduction biases for the output transistor and the monitor transistor according as a voltage at a specific point in the first resistor circuit drops relative to a voltage at the output side of the monitor transistor.

In this construction, as the output current increases, the current flowing through the output transistor increases, and so does the current flowing through the monitor transistor. In response, the first means acts to decrease the output currents of the output transistor and the monitor transistor. On the other hand, as the current flowing through the output transistor decreases, more of the current flowing through the first resistor circuit is diverted to the output terminal, and thus the voltage at the predetermined point in the first resistor circuit drops. In response, the second means acts to further decrease the current flowing through the output transistor, and thus the voltage at the predetermined point in the first resistor circuit further drops. As this operation cycle is repeated, the output voltage drops rapidly to zero, and hence the output current reduces rapidly.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 3:
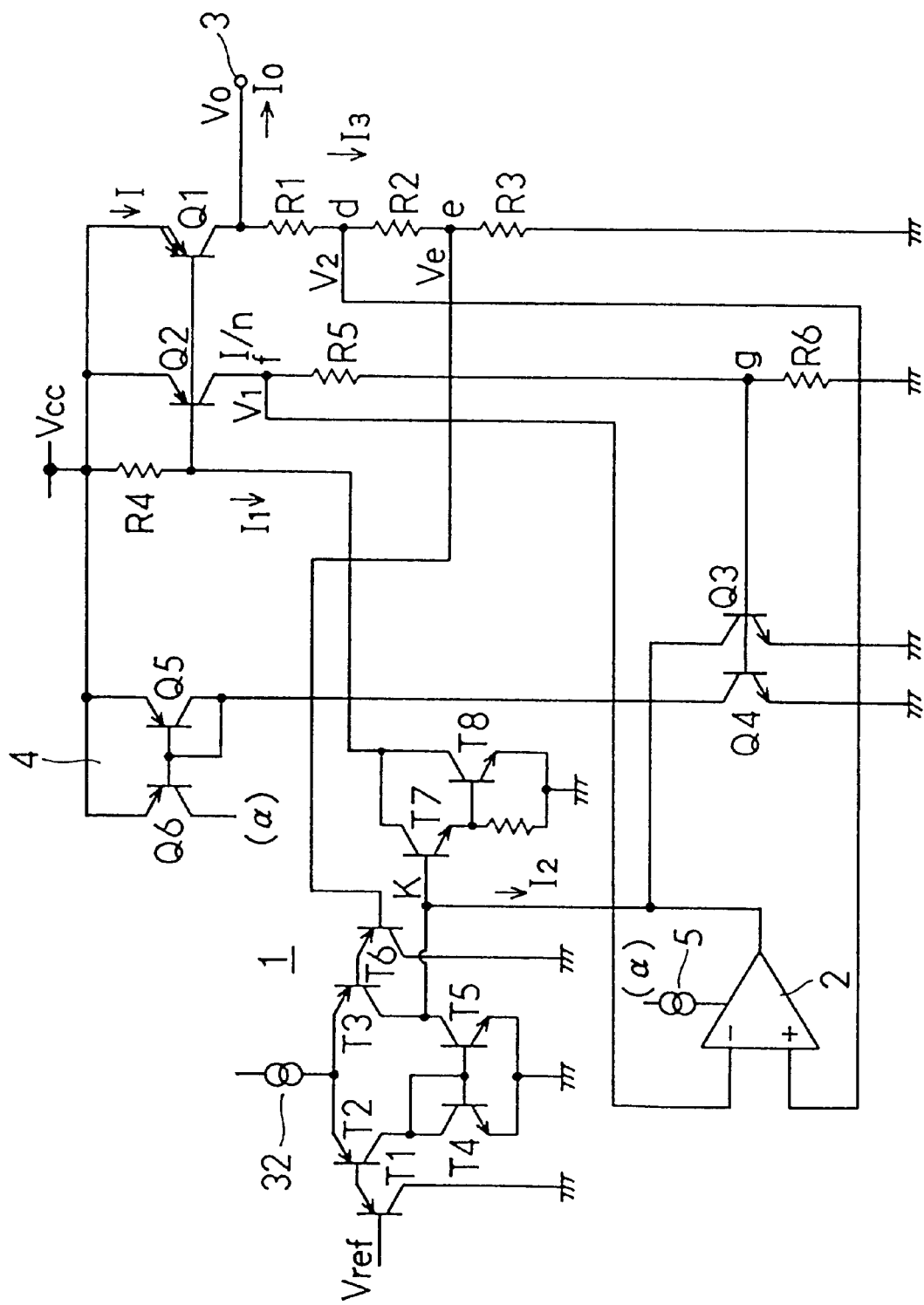
FIG. 3 is a circuit diagram of the output transistor protection circuit of a first embodiment of the present invention.

Hereinafter, embodiments of the present invention will be described with reference to the drawings. FIG. 3 is a circuit diagram of the output transistor protection circuit of a first embodiment of the present invention. In this protection circuit, a pnp-type transistor is used as an output transistor Q1, and another pnp-type transistor is used as a monitor transistor Q2. The collector of the output transistor Q1 is connected to an output terminal 3 and is also connected through resistors R1, R2, and R3 to ground. The collector of the monitor transistor Q2 is connected through resistors R5 and R6 to ground.

Both the transistors Q1 and Q2 have their emitter connected to the power source Vcc. These transistors Q1 and Q2 are so formed that, when the output transistor Q1 outputs an output current I, a current I/n (where n>1) times as high as that current I flows through the monitor transistor Q2. This can be achieved by adjusting the sizes of the emitter areas of the transistors Q1 and Q2. R4 represents a bias resistor for the transistors Q1 and Q2.

Figure 1:
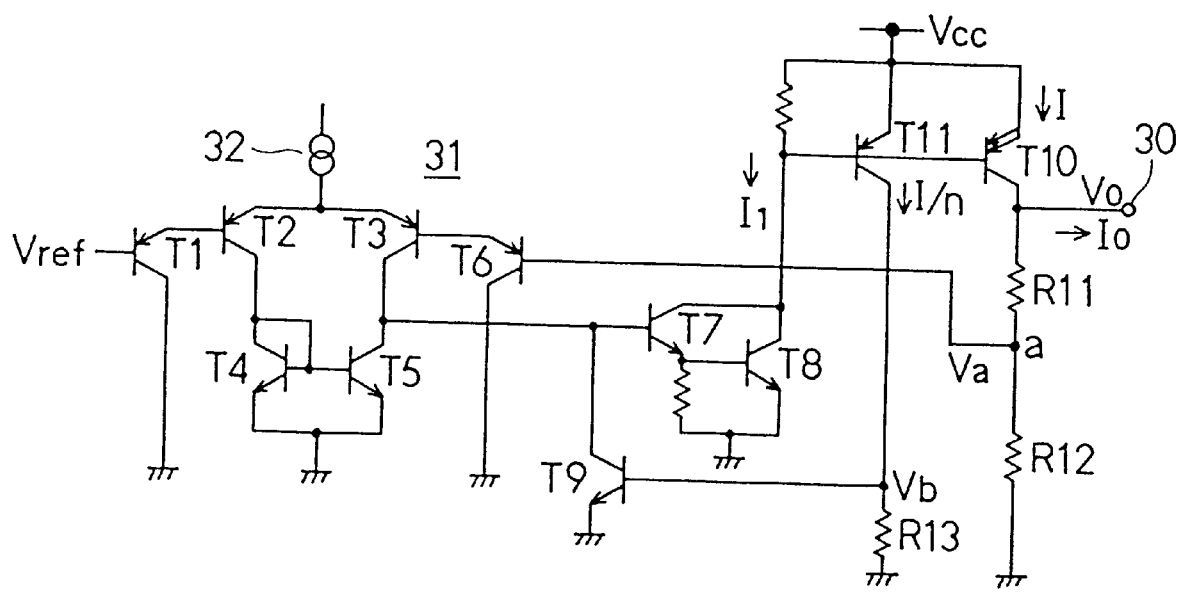
FIG. 1 is a circuit diagram of a conventional output transistor protection circuit.
Figure 2:
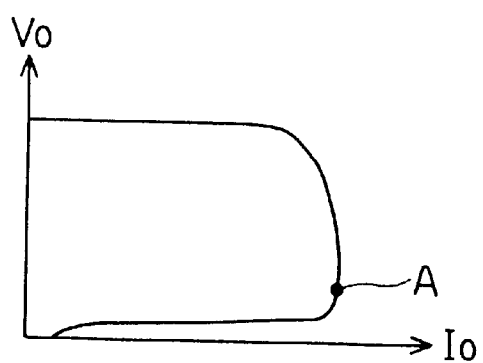
FIG. 2 is a diagram showing the output-current to output-voltage characteristic of the conventional output transistor protection circuit.

Transistors T1 to T8 and a constant current source 32 constitute a first comparator 1, which is identical with the comparator 31 in the conventional protection circuit described previously and shown in FIG. 1. Of these transistors, T1 to T6 constitute a comparison portion, and T7 and T8 constitute an output portion. The first comparator 1 compares the voltage Ve at the node e between the resistors R2 and R3 with a reference voltage Vref, which is a fixed direct-current voltage. The comparison output from the first comparator 1 is passed through the transistor T8 as its collector current, and is then fed to the bases of the transistors Q1 and Q2 as feedback.

To the node g between the resistors R5 and R6, the bases of transistors Q3 and Q4 are connected; both of these transistors Q3 and Q4 have their emitter connected to ground. The collector of the transistor Q3 is connected to the node k that connects to the base of the transistor T7 of the first comparator 1. The collector of the transistor Q4 is connected to the input side of a current mirror circuit 4. The current mirror circuit 4 is composed of a pair of pnp-type transistors Q5 and Q6, both of which have their emitter connected to the power source Vcc. The output (α) of the current mirror circuit 4 is coupled to a constant current source 5 in a second comparator 2. The second comparator 2 receives, at its first input terminal, the voltage $V_1$ at the node f that connects to the collector of the transistor Q2 and, at its second input terminal, the voltage $V_2$ at the node d between the resistors R1 and R2. In the figure, the symbol '−' denotes the inverting terminal of the comparator, and the symbol '+' denotes its non-inverting terminal. The output terminal 3 is connected to a load (not shown).

The protection circuit of the first embodiment operates as follows. The resistances of the resistors R1, R2, R3, R5, and R6 are so determined that the voltage $V_2$ at the node d is kept higher than the voltage $V_1$ at the node f when there is no rush current flowing, that is, when the output current Io is within a normal range.

In normal condition, the current I/n is sufficiently low to keep the voltage at the node g lower than the threshold voltage of the transistors Q3 and Q4. This keeps the transistors Q3 and Q4 off, and also the current mirror circuit 4 off. Accordingly, the second comparator 2 remains inactive. In this condition, a feedback loop formed by the first comparator 1 acts to keep the voltage Ve at the node e equal to the reference voltage Vref.

As the output current Io increases out of the normal range, the current I flowing through the output transistor Q1 increases, and the current I/n flowing through the monitor transistor Q2 also increases. As a result, the voltage at the node g rises above the threshold voltage of the transistors Q3 and Q4, and thereby turns on these transistors Q3 and Q4. Conduction of the transistor Q3 causes a current $I_2$ to flow from the node k in the first comparator 1 to the transistor Q3, and thereby reduces the collector current $I_1$ of the transistor T8. As the current $I_1$ decreases, the conductance of the transistors Q1 and Q2 decreases, and consequently the currents I and I/n decrease.

On the other hand, conduction of the transistor Q4 activates the current mirror circuit 4, and thus activates also the second comparator 2. At this time, if $V_2$ is higher than $V_1$, the second comparator 2 does not affect the current $I_2$ in any significant way. However, as the current Io further increases, and thus more of the current flowing through the resistors R1, R2, and R3 is diverted to the output terminal 3, the voltage $V_2$ drops, and consequently $V_1$ becomes higher than $V_2$.

Figure 4:
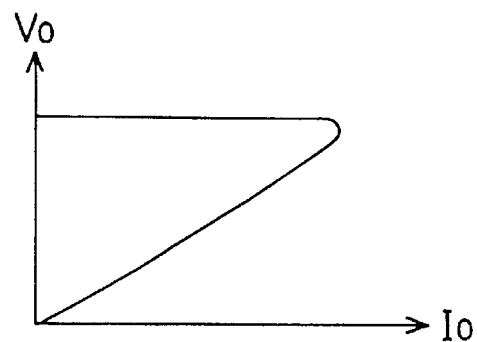
FIG. 4 is a diagram showing the output-current to output-voltage characteristic of the output transistor protection circuit of the first embodiment.

In this condition, the second comparator 2 outputs a low-level voltage, and thereby causes the current $I_2$ flowing from the node k to increase. As a result, the conductance of the transistors Q7 and Q8 decreases, causing the current $I_1$ and thus the current I to decrease further. Consequently, more of the current $I_3$ is diverted to the output terminal 3, and thus $V_2$ drops further. As this operation cycle is repeated, the output voltage Vo drops rapidly to zero, and the output current Io also drops rapidly to zero as shown in FIG. 4.

In this way, in the protection circuit of the first embodiment, overcurrent such as rush current is suppressed rapidly. Moreover, even if, because of malfunction or trouble on the part of the load, the output voltage Vo is clamped at a low voltage and, as a result, a high voltage is applied between the emitter and collector of the transistor Q1, only a low current flows therethrough, and thus the transistor Q1 is protected from destruction.

Figure 5:
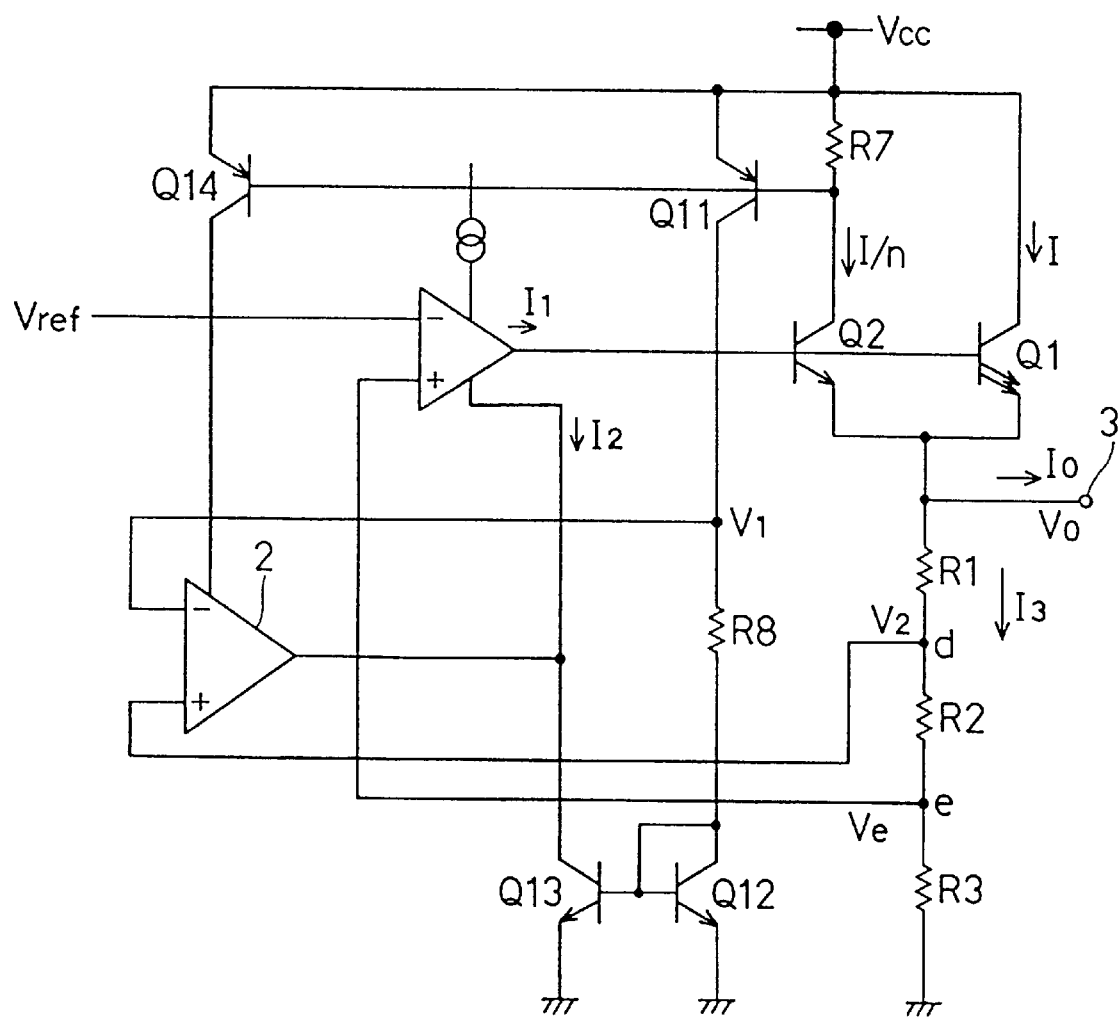
FIG. 5 is a circuit diagram of the output transistor protection circuit of a second embodiment of the present invention.

FIG. 5 is a circuit diagram of the output transistor protection circuit of a second embodiment of the present invention. In this protection circuit, an npn-type transistor is used as an output transistor Q1, and accordingly another npn-type transistor is used as a monitor transistor Q2. The emitters of the transistors Q1 and Q2 are connected to the same resistor circuit composed of resistors R1, R2, and R3.

The collector of the output transistor Q1 is connected directly to the power source Vcc. On the other hand, the collector of the monitor transistor Q2 is connected through a resistor R7 to the power source Vcc and is also connected directly to the bases of two pnp-type transistors Q11 and Q14. The emitters of the transistors Q11 and Q14 are connected to the power source Vcc.

The collector of the transistor Q11 is connected through a resistor R8 to the collector and base of an npn-type transistor Q12. This transistor Q12, together with another transistor Q13, constitutes a current mirror circuit. The collector of the transistor Q13, which is the output-side transistor of the current mirror circuit, is connected to the output side of first and second comparators 1 and 2. The transistors Q12 and Q13 are at their emitter connected to ground. The first comparator 1 has the same construction as the first comparator 1 of the first embodiment described earlier. Therefore, the collector of the transistor Q13 is connected to the node k of the comparator 1 (see FIG. 3). The second comparator 2 is connected, at its inverting terminal (−), to the collector of the transistor Q11 and, at its non-inverting terminal (+), to the node d between the resistors R1 and R2. Accordingly, the second comparator 2 receives, at its inverting terminal (−), the voltage $V_1$ and, at its non-inverting terminal (+), the voltage $V_2$.

The protection circuit of the second embodiment operates as follows. In FIG. 5, when the output current Io is low, the currents I and I/n are also low. As a result, the voltage drop across the resistor 7 is small, and thus the transistor Q11 remains off. In this condition, since the transistor Q14 also remains off and thus does not supply power to the second comparator 2, the second comparator 2 remains inactive, and therefore only the first comparator 1 is active. Specifically, the first comparator 1 compares the voltage Ve at the node e with a reference voltage Vref, and controls the base currents of the transistors Q1 and Q2 by the use of a current $I_1$ produced in accordance with the voltage difference. In this way, feedback is achieved to keep the voltage Ve equal to the voltage Vref.

As the output current Io increases, the currents I and I/n also increase, and accordingly the voltage drop across the resistor R7 increases. As a result, the transistor Q11 is turned on, and thus the transistors Q12 and Q13 are also turned on, causing a current $I_2$ to flow. When this current $I_2$ starts to flow, the sum of the base currents of the transistors Q1 and Q2 decreases to $(I_1-I_2)$. As a result, the conductance of the transistors Q1 and Q2 decreases, and consequently the currents I and I/n decrease.

When momentary overcurrent such as rush current occurs in the output current Io, not only the first comparator 1 operates to control the transistors Q1 and Q2 as described above, but also the second comparator 2 is activated. Specifically, in such a case, the voltage $V_2$ at the node d drops below the voltage $V_1$, and accordingly the second comparator 2 outputs a low level. As a result, the current $(I_1-I_2)$ further decreases, and thus the currents flowing through the transistors Q1 and Q2 further decrease.

This causes the current $I_3$ from the transistors Q1 and Q2 to decrease, and accordingly the voltage $V_2$ drops further. As a result, more current flows into the second comparator 2, and thus the currents flowing through the transistors Q1 and Q2 further decrease. As this operation cycle is repeated, both the output current Io and the output voltage Vo drop rapidly to zero.

Figure 6:
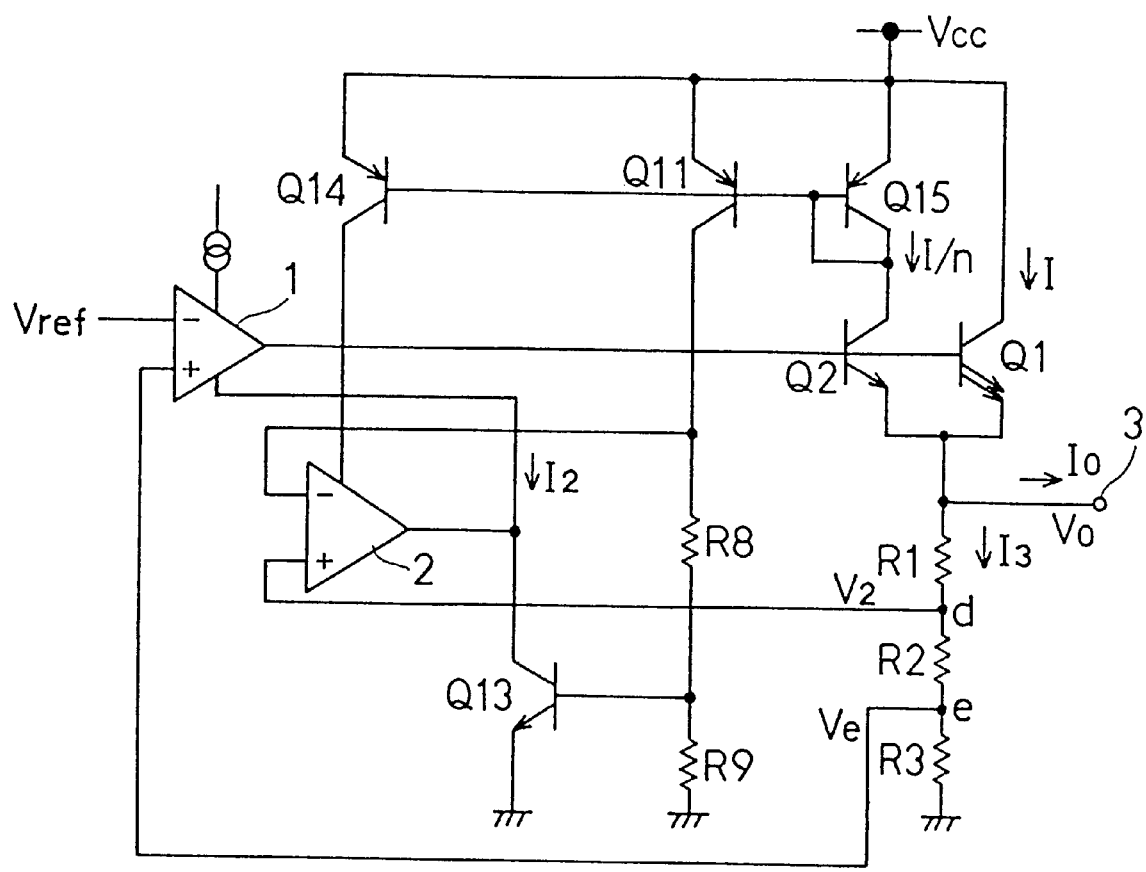
FIG. 6 is a circuit diagram of the output transistor protection circuit of a third embodiment of the present invention.

FIG. 6 is a circuit diagram of the output transistor protection circuit of a third embodiment of the present invention. This protection circuit has substantially the same construction as the protection circuit of the second embodiment. The only differences are that a pnp-type transistor Q15 is provided instead of the resistor R7 in FIG. 5 to form a current mirror circuit together with the transistors Q11 and Q14, and that a resistor R9 is provided instead of the transistor Q12 in FIG. 5. Here, of the three pnp-type transistors Q15, Q14, and Q11 constituting the current mirror circuit, the transistor Q15 has its base and collector connected to the collector of the monitor transistor Q2 and has its emitter connected to the power source Vcc; the transistors Q11 and Q14 have their bases connected to the base of the transistor Q15, and have their emitters connected to the power source Vcc. The transistor Q11 has its collector connected through the resistors R8 and R9 to ground.

However, in the third embodiment shown in FIG. 6, the current that flows through the transistor Q11 is higher than in the second embodiment shown in FIG. 5. Accordingly, of these two embodiments, the second embodiment shown in FIG. 5 is preferable from the viewpoint of power consumption reduction.

As described above, according to the present invention, in an output transistor protection circuit, the output voltage can be reduced to zero instantaneously in response to even momentary overcurrent. Moreover, even when the output voltage is clamped at a low level because of malfunction of succeeding circuits (the load), the current flowing into the load can be reduced to a minimum. As a result, the output transistor can be protected far more effectively than in conventional output transistor protection circuits.

What is claimed is:

1. An output transistor protection circuit comprising:
   a monitor transistor whose base and emitter are connected to a base and an emitter, respectively, of an output transistor and through which passes a current 1/n (where n>1) times as high as an output current of the output transistor;
   a detector that produces a detection output when the current passing through the monitor transistor exceeds a predetermined value;
   a first circuit that operates so as to decrease conduction biases for the output transistor and the monitor transistor in accordance with the detection output from the detector when the current passing through the monitor transistor exceeds the predetermined value;
   a voltage monitoring circuit for monitoring a voltage at an output side of the output transistor;
   a second circuit that is controlled by an output from the voltage monitoring circuit so as to further decrease the conduction biases for the output transistor and the monitor transistor as the voltage at an output side of the output transistor drops; and
   a third circuit that puts the second circuit in an active state in response to the detection output from the detector and that puts the second circuit in a non-active state when there is no detection output from the detector.

2. An output transistor protection circuit as claimed in claim 1,
   wherein the voltage monitoring circuit comprises:
   a series of resistors connected between an output electrode of the output transistor and ground; and means for extracting a voltage from a node within the series of resistors.

3. An output transistor protection circuit as claimed in claim 2,
wherein the detector includes a resistor with which an output current of the monitor transistor is converted into a voltage
and a transistor that receives this voltage at its base.

4. An output transistor protection circuit for protecting a pnp-type output transistor whose emitter is connected to a power source and whose collector is connected to an output terminal, comprising:
first, second, and third resistors connected in series between the collector of the output transistor and a ground-level voltage point;
a pnp-type monitor transistor whose base and emitter are connected to a base and the emitter, respectively, of the output transistor;
fourth and fifth resistors connected in series between a collector of the monitor transistor and the ground-level voltage point;
first means connected to a node between the fourth and fifth resistors so as to reduce base currents of the output transistor and the monitor transistor in response to a voltage at that node when a current passing through the monitor transistor exceeds a predetermined level;
a comparator having its first input terminal connected to the collector of the monitor transistor and having its second input terminal connected to a node between the first and second resistors so as to compare a voltage $V_1$ applied to the first input terminal with a voltage $V_2$ applied to the second input terminal, the comparator reducing the base currents of the output transistor and the monitor transistor when the voltage $V_1$ is higher than the voltage $V_2$.

5. An output transistor protection circuit as claimed in claim 4, further comprising:
means for activating the comparator only when the current passing through the monitor transistor is above the predetermined level.

6. An output transistor protection circuit as claimed in claim 4, further comprising:
feedback control means connected to the base of the output transistor so as to keep a voltage at a node between the second and third resistors equal to a predetermined fixed voltage except when a rush current flows through the output transistor.

7. An output transistor protection circuit comprising:
a monitor transistor whose base and emitter are connected to a base and an emitter, respectively, of an output transistor and through which passes a current 1/n (where n>1) times as high as an output current of the output transistor;
a first resistor circuit composed of a plurality of resistors connected between an output electrode of the output transistor and a fixed-voltage point;
an output terminal connected to the output electrode of the output transistor;
a second resistor circuit composed of a plurality of resistors connected between an output electrode of the monitor transistor and the fixed-voltage point;
a detector that produces a detection output when a voltage at a predetermined point in the second resistor circuit exceeds a predetermined level:
a first circuit that decreases conduction biases for the output transistor and the monitor transistor in accordance with the detection output of the detector when the current passing through the monitor transistor exceeds a predetermined value;
a second circuit that further decreases the conduction biases for the output transistor and the monitor transistor as a voltage at a predetermined point in the first resistor circuit drops relative to a voltage at the output electrode of the monitor transistor: and
a third circuit that puts the second circuit in an active state in response to the detection output from the detector and that puts the second circuit in a non-active state when there is no detection output from the detector.

8. An output transistor protection circuit as claimed in claim 7,
wherein the second circuit includes a comparator for comparing the voltage at the output electrode of the monitor transistor and the voltage at the predetermined point in the first resistor circuit.

9. An output transistor protection circuit for protecting an npn-type transistor whose collector is connected to a power source and whose emitter is connected to an output terminal, comprising:
a resistor circuit composed of a series of resistors connected between the emitter of the output transistor and ground;
an npn-type monitor transistor whose base and emitter are connected to a base and the emitter, respectively, of the output transistor;
a first resistor connected between a collector of the monitor transistor and the power source;
a third transistor of a pnp-type that has its base connected to a node between the collector of the monitor transistor and the first resistor, has its emitter connected to the power source, and has its collector connected through a second resistor to ground so as to be turned on when a current passing through the monitor transistor exceeds a predetermined level;
first means for reducing base currents of the monitor transistor and the output transistor when the third transistor is on; and
second means provided with a comparator whose first input terminal is connected to the collector of the third transistor and whose second input terminal is connected to a node within the series of resistors so as to reduce the base currents of the monitor transistor and the output transistor when a voltage applied to the first input terminal is higher than a voltage applied to the second input terminal.

10. An output transistor protection circuit for protecting an npn-type transistor whose collector is connected to a power source and whose emitter is connected to an output terminal, comprising:
a resistor circuit composed of a series of resistors connected between the emitter of the output transistor and ground;
an npn-type monitor transistor whose base and emitter are connected to a base and the emitter, respectively, of the output transistor;
a first transistor of a pnp-type having its collector and base connected to a collector of the monitor transistor and having its emitter connected to the power source;
a second transistor of a pnp-type having its base connected to the base of the first transistor, having its emitter connected to the power source, and having its collector connected through a resistor to ground;

first means for reducing base currents of the monitor transistor and the output transistor when a current passing through the second transistor exceeds a predetermined level; and second means provided with a comparator whose first input terminal is connected to the collector of the second transistor and whose second input terminal is connected to a node within the series of resistors so as to reduce the base currents of the monitor transistor and the output transistor when a voltage applied to the first input terminal is higher than a voltage applied to the second input terminal.

* * * * *